(12) United States Patent
Xu et al.

(10) Patent No.: US 8,340,934 B2
(45) Date of Patent: Dec. 25, 2012

(54) METHOD OF PERFORMANCE ANALYSIS FOR VRLA BATTERY

(75) Inventors: Jianhong Xu, Hangzhou (CN); Ling Yuan, Hangzhou (CN); Yi Zheng, Hangzhou (CN)

(73) Assignee: Hangzhou Gold Electronic Equipment Co., Ltd., Hangzhou, Zhejiang Province (CN)

( * ) Notice: Subject to any disclaimer, the term of this patent is extended or adjusted under 35 U.S.C. 154(b) by 445 days.

(21) Appl. No.: 12/596,698

(22) PCT Filed: Apr. 17, 2008

(86) PCT No.: PCT/CN2008/000781
§ 371 (c)(1),
(2), (4) Date: Oct. 20, 2009

(87) PCT Pub. No.: WO2008/128427
PCT Pub. Date: Oct. 30, 2008

(65) Prior Publication Data
US 2010/0131218 A1 May 27, 2010

(30) Foreign Application Priority Data
Apr. 20, 2007 (CN) .......................... 2007 1 0068082

(51) Int. Cl.
*G01R 31/36* (2006.01)
(52) U.S. Cl. .......... 702/63; 324/426; 324/430; 320/132; 320/156; 320/145; 320/134
(58) Field of Classification Search .................... 702/63; 324/426, 430, 431, 439; 320/132, 156, 107, 320/116, 145, 134
See application file for complete search history.

(56) References Cited

U.S. PATENT DOCUMENTS

| | | | |
|---|---|---|---|
| 5,250,904 A * | 10/1993 | Salander et al. | 324/430 |
| 5,977,750 A | 11/1999 | Ng et al. | |
| 6,611,774 B1 * | 8/2003 | Zaccaria | 702/63 |
| 6,738,450 B1 * | 5/2004 | Barford | 378/58 |
| 6,885,195 B2 * | 4/2005 | Bertness | 324/426 |
| 7,199,557 B2 * | 4/2007 | Anbuky et al. | 320/132 |

(Continued)

FOREIGN PATENT DOCUMENTS

| | | |
|---|---|---|
| CN | 1264471 A | 8/2000 |
| CN | 1696847 A | 11/2005 |
| CN | 1879251 A | 12/2006 |
| CN | 1890574 A | 1/2007 |
| JP | 2001-296341 A | 10/2001 |
| JP | 2007-120960 A | 5/2007 |
| WO | WO 2005013409 A1 * | 2/2005 |

OTHER PUBLICATIONS

N. Gershenfeld, B. Schoner, and E. Metois, "Cluster weighted modeling for time-series analysis," Nature, vol. 397, pp. 329-332, Jan. 1999.* Gu, Limin et al., Design of Adaptive Fuzzy Controller of Molten Carbonate Fuel Cell Stack, Journal of Shanghai Jiaotong University, Jan. 2002, vol. 36 No. 1 pp. 138-140.

*Primary Examiner* — Carol Tsai
(74) *Attorney, Agent, or Firm* — Jacobson Holman PLLC

(57) ABSTRACT

This invention discloses a method of performance analysis for VRLA battery which applies the method of using the float voltage dispersion ratio of the battery to evaluate the battery performance from a new perspective, and it is an online real-time test which applies several ways to evaluate the performance of the VRLA battery. According to the relevance between the dispersion of the float charge voltage of the battery and its performance, the method gets the result of the battery performance through calculating the battery float charge voltage dispersion ratio and making it relevant with the battery performance. It has small workload, convenient operation and no danger to the system when doing online testing. It also won't affect the cycle life of the VRLA battery.

5 Claims, 3 Drawing Sheets

U.S. PATENT DOCUMENTS

| | | | |
|---|---|---|---|
| 7,446,510 B2* | 11/2008 | Chou et al. | 320/156 |
| 7,567,085 B2* | 7/2009 | Kim et al. | 324/426 |
| 7,633,265 B2* | 12/2009 | Matsushima et al. | 320/134 |
| 7,772,851 B2* | 8/2010 | Al-Anbuky et al. | 324/430 |
| 8,035,396 B2* | 10/2011 | Kim | 324/430 |
| 2005/0017685 A1* | 1/2005 | Rees et al. | 320/132 |
| 2007/0080668 A1* | 4/2007 | Al-Anbuky et al. | 320/136 |
| 2008/0048623 A1* | 2/2008 | Le Gall et al. | 320/145 |
| 2008/0231284 A1* | 9/2008 | Birke et al. | 324/426 |
| 2008/0286622 A1* | 11/2008 | Shaw et al. | 429/23 |
| 2008/0303528 A1* | 12/2008 | Kim | 324/430 |
| 2010/0234705 A1* | 9/2010 | Lynn | 600/324 |

\* cited by examiner

METHOD OF PERFORMANCE ANALYSIS FOR VRLA BATTERY

This is a U.S. national stage application under 35 U.S.C. 371 of PCT/CN2008/000781, filed on Apr. 17, 2008 and published in Chinese, claiming priority from Chinese Application No. 200710068082.3, filed Apr. 20, 2007.

RELEVANT FIELD

This invention relates to the battery performance analysis method in the operating process of the valve-regulated lead-acid battery (VRLA battery).

BACKGROUND OF THE INVENTION

The valve-regulated lead-acid battery has been widely used in power supply systems of industries like electricity, communications, transportation, finance and army, as back up in substation, machine room, mobile base station, UPS and start up for generators. It is used to provide continuous electricity supply to the electrical load when the commercial power has power supply failure or the commutator breaks down. Therefore the battery plays a very important role in the power supply system.

VRLA is a complicated electrochemical system whose service life and performance are related to many factors including the material of electrodes, techniques, the change of active material and operating situation, etc, and it is also one of the parts of the equipment which is easy to break down. In general, the cause of the performance decrease of VRLA can be briefly classified as follows: dehydration, sulfation, corrosion and deformation of grid, softening of active material and short circuit of dendrite, etc.

There are several methods of battery testing currently used as follows: checking discharge testing, in-process voltage checking, battery internal resistance (conductance) testing and discharge capacity estimating.

1. Checking Discharge Testing

As the standard of battery capacity, checking discharge testing is the most standard and effective performance testing method for the battery, which can completely reflect the battery capacity. It can be used online or offline to measure.

Unfortunately, checking discharge testing has great workload, inconvenient operation and potential danger to the system when doing online testing. This method is not suitable to be used frequently due to the battery limited cycle life. It also does not have the function of real-time monitoring for the battery working situation.

2. In-Process Voltage Checking

Among the current battery testing equipments, the common online monitoring device is in-process checking instrument for battery set which is generally used for online monitoring the voltage, current and temperature of a single battery to judge whether the battery is good or bad according to the voltage.

Lots of practical experience shows that, the battery voltage (float charge or equalized charge) during operation almost has no relevance to the battery capacity. Battery voltage has measurement value only for the battery in serious exhaustion, open circuit or short circuit, but not for those still normal or slightly decreasing. It will only bring misleading if based on the voltage of in-process checking. In actual practice, we generally use it as the observation and record of battery charge curve or battery float charge data.

3. IR (Conductance) Testing of the Battery

In the 1992 INTELEC, Dr. David Feder delivered a thesis on the relevance between conductance and battery capacity which brought up the meaning of the conductance measurement to the battery. Because of its convenience, its function of finding failure batteries and its sensitivity of IR increase due to battery dehydration, the IR or conductance testing method has important reference value of finding failure battery in time and grasping the change of the battery performance.

The dehydration of the battery, the sulfation of the negative pole, the corrosion acceleration of the grid will lead to the battery performance degradation that is the capacity decrease, which will lead to the increase of the battery IR. However, it is also a pity that the battery capacity doesn't have good relevance to the battery conductance. When the battery capacity is above 80%, the battery capacity almost has no relevance to the battery conductance. Most of batteries which have this linear relation are failure ones whose discharge capacity is below 80%. Therefore, the value of actual measurement is low.

4. Discharge Capacity Estimating

It estimates the residual capacity of the battery through 5-15 minutes' load discharge. The theoretical basis of this testing method is comparing to the experiential discharge curves. However, when the battery performance degrades seriously, the discharge curve will change a lot which will lead to the serious deviation of the estimated value. Meanwhile, because of the different battery manufacturers and batteries themselves, which will also lead to the deviation of the estimating. Therefore this method is seldom used now.

SUMMARY OF THE INVENTION

To solve the abovementioned problems, this invention applies the method of using the battery float voltage dispersion ratio to evaluate the battery performance from a new perspective, and it is an online testing which applies several ways to evaluate the VRLA battery performance.

FIG. 1 is the changing situation of the battery float charge voltage of one manufacturer within half a year since the battery set running. It can be seen that their float charge voltages tend to be the same and the dispersion is small. That's because when battery just left factory, the absorption of electrolytic solution and the formation of the pole is insufficient. The battery performance in the primary running period tends to be the same. On the contrary, when the battery performance worsens, the float charge voltage tends to disperse.

From FIG. 2 we can clearly see that, the voltages of the batteries with good performance have small change during the running process while that of the ones with bad performance have relatively big change. The battery set operates in series connection; the voltage change is different in each battery when the same condition of current change, which reflects the battery running condition and its health state as well.

With the increase of the battery service time, the battery performance is worsening, the battery capacity is decreasing and the dispersion of the float charge voltage is becoming larger. Then the dispersion of its float charge voltage has relevance to its capacity.

The technical solution applied to solve the abovementioned problems is: a method of performance analysis for VRLA battery, whose feature is to consecutively gather the VRLA battery float charge voltage variables, to do the cluster and weighted analysis, and then to obtain the result.

The mentioned float charge voltage parameters are any one or the combination of several ones among those as follows: the float charge voltage variable of a single battery relative to itself, the float charge voltage variable of a single battery relative to the battery set, the variable of the float charge voltage dispersion ratio of a single battery relative to itself and the variable of the float charge voltage dispersion ratio of a single battery relative to the battery set.

The mentioned float charge voltage variable of a single battery relative to itself is got through the following procedures: store the float charge voltage of each battery in a certain period; calculate the change of the float charge voltage of each battery relative to itself in this period.

The mentioned float charge voltage variable of a single battery relative to itself is calculated by equation (1):

$$\mu_i = \frac{1}{n}\sum_{j=0}^{n} U_{ij}, \Delta U_{ij} = |U_{ij} - \mu_i| \quad (1)$$

Where:
$U_{ij}$: The voltage of the battery i at the moment j;
$\mu_i$: Average float charge voltage of the battery i in sample period n;
n: Sample period;
$\Delta U_{ij}$: float charge voltage variable of a single battery relative to itself.

The mentioned float charge voltage variable of a single battery relative to the battery set is got through following procedures: store the float charge voltage of each battery in a certain period; calculate the change of the float charge voltage of each battery relative to the battery set in this period.

The mentioned float charge voltage variable of a single battery relative to the battery set is calculated by equation (2)

$$\mu_j = \frac{1}{num}\sum_{i=1}^{num} U_{ij}, \Delta U'_{ij} = |U_{ij} - \mu_j| \quad (2)$$

Where:
$U_{ij}$: The voltage of the battery i at the moment j;
$\mu_j$: Average float charge voltage of the battery set at the moment j;
num: Battery number of the battery set;
$\Delta U_{ij}'$: float charge voltage variable of a single battery relative to the battery set.

The mentioned variable of the float charge voltage dispersion ratio of a single battery relative to itself is got through following procedures: store the float charge voltage of each battery in a certain period; calculate the variable of the float charge voltage dispersion ratio of a single battery relative to itself based on probability and statistics.

The mentioned variable of the float charge voltage dispersion ratio of a single battery relative to itself is calculated by equation (3):

$$\mu_{ik} = \frac{1}{M}\sum_{j=(k-1)*M+1}^{k*M} U_{ij}, \sigma_{ik} = \sqrt{\frac{\sum_{m=1}^{M}(U_{im} - \mu_{ik})^2}{M}} \quad (3)$$

Where:
$U_{ij}$: The voltage of the battery i at the moment j;
n: Sample period; separate the period n into K sections by each M points of time, k∈[1, K];
$U_{im}$: The float charge voltage of the battery i at the moment m in the k time section;
$\mu_{ik}$: The average float charge voltage of battery i in the k time section;
$\sigma U_{ik}$: The standard deviation of the float charge voltage in the k time section;

The mentioned variable of the float charge voltage dispersion ratio of a single battery relative to battery set is got through following procedures: store the float charge voltage of each battery in a certain period; calculate the variable of the float charge voltage dispersion ratio of a single battery relative to the battery set based on probability and statistics.

The mentioned variable of the float charge voltage dispersion ratio of a single battery relative to the battery set is calculated by equation (4):

$$\mu_k = \frac{1}{num}\sum_{i=1}^{num} M\mu_{ik}, \sigma_k = \sqrt{\frac{\sum_{i=1}^{num}(M\mu_{ik} - \mu_k)^2}{num}} \quad (4)$$

Where:
n: Sample period; separate the period n into K sections by each M points of time, k∈[1,K];
$\mu_{ik}$: The average float charge voltage of the battery i in the k time section;
$\mu_k$: The average float charge voltage of battery set in the k time section;
$\sigma_k$: The standard deviation of the float charge voltage of battery set in the k time section;
num: Battery number of battery set.

This invention finds out the relevance between the dispersion of the battery float charge voltage and its performance. It invents the calculation method of the float charge voltage dispersion ratio of the battery and the method of making it relevant with the battery performance to get the result of the battery performance. The analysis method for the battery performance of this invention has small workload, convenient operation and no danger to the system when doing online testing. The method also won't affect the cycle life of the VRLA battery.

DETAILED DESCRIPTION

This example is the battery performance analysis method and its structure based on the float charge voltage dispersion ratio. The main operating process of this invention is as follows: the monitoring device for the battery set sends the order, and the acquisition device gathers the float charge voltage of the battery. The data input into the software which contains the calculation method of this invention to calculate and analyze the battery performance.

Figure 1:
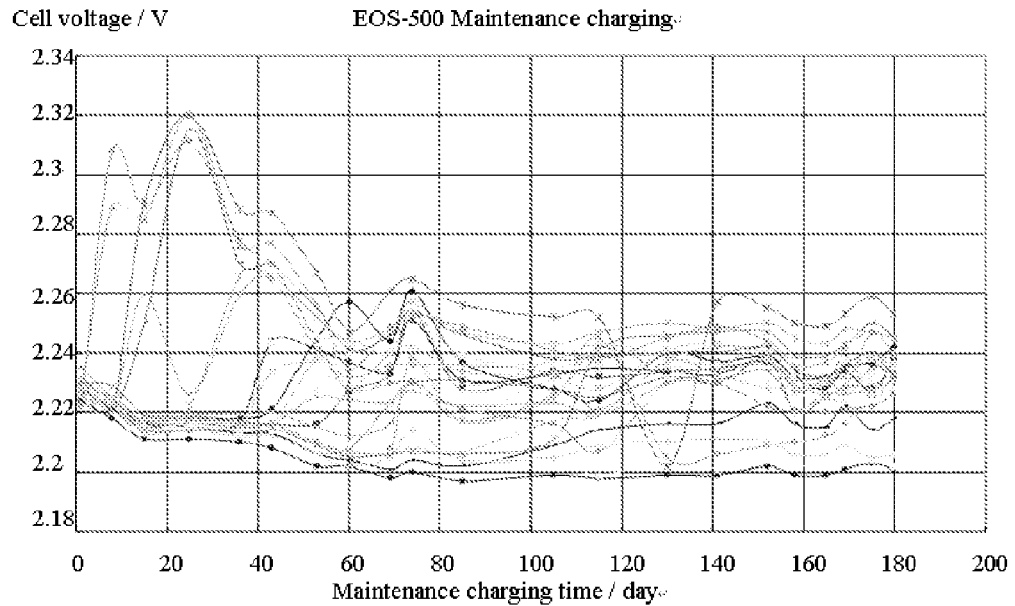
FIG. 1 shows the changing situation of the battery float charge voltage of one manufacturer within half a year since the battery set works.
Figure 2:
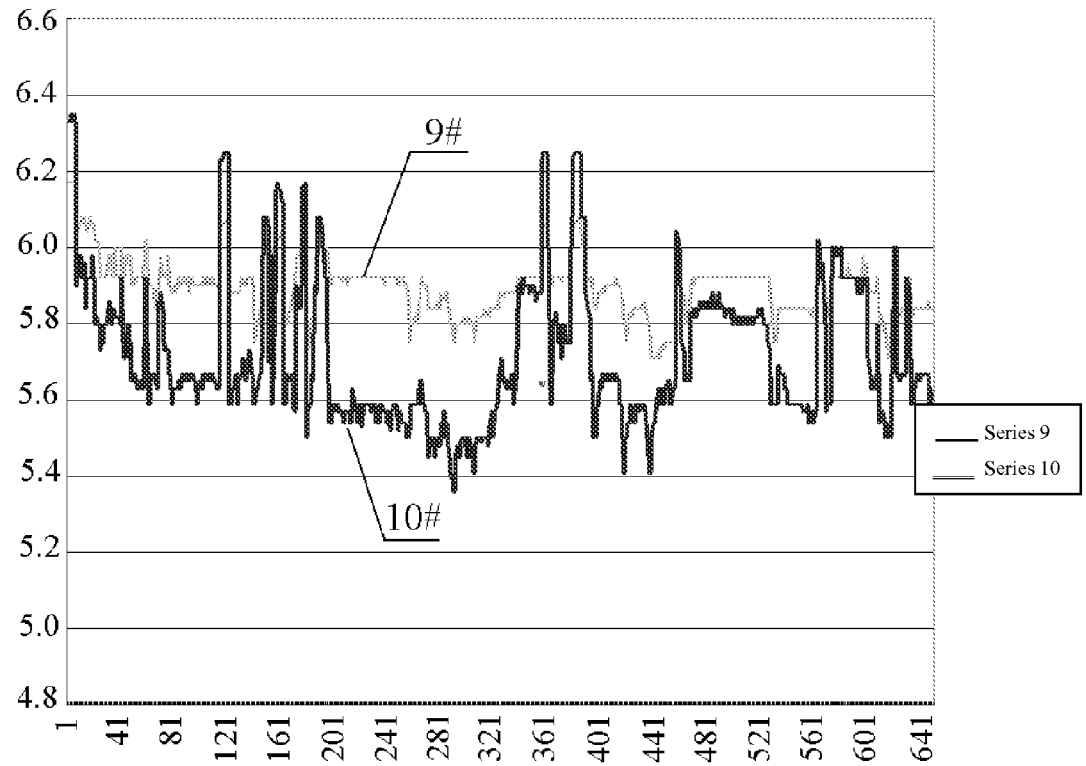
FIG. 2 shows the changing situation of the float charge voltage of two series of batteries of one manufacturer.
Figure 3:
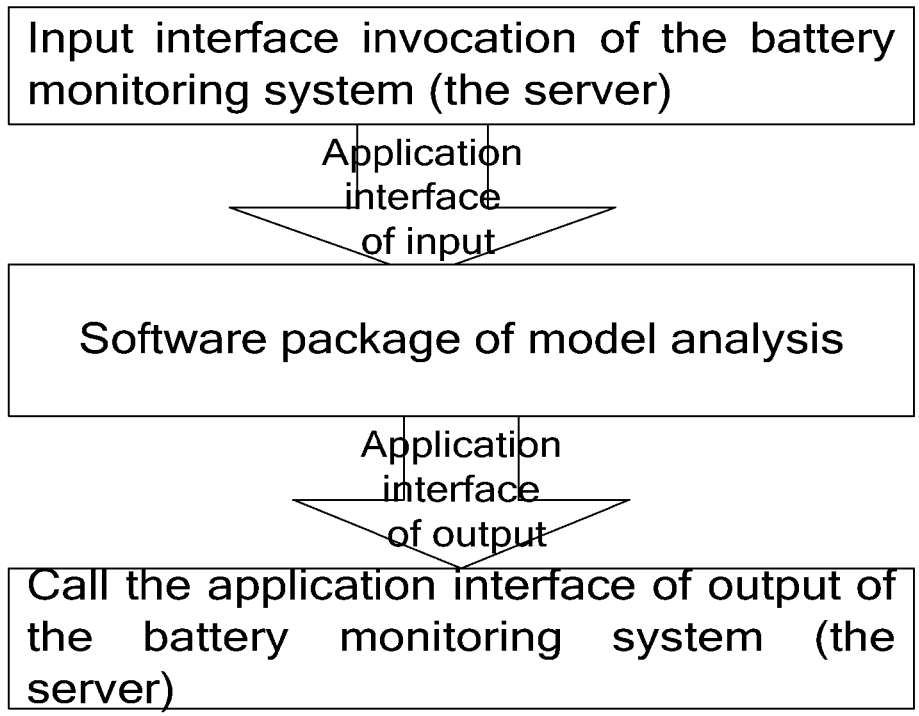
FIG. 3 is the application drawing of the system of this invention.
Figure 4:
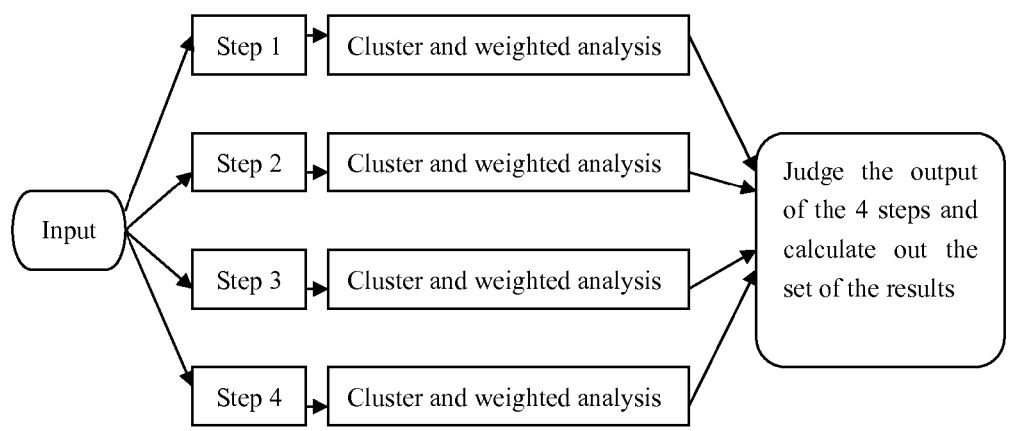
FIG. 4 is the flow chart of the specific process of this invention.

See FIG. 3 for the application of the software system about the battery performance analysis method, in which, the software package of model analysis refers to this method. See FIG. 4 for the flow chart of the specific process of the battery performance analysis method based on the float charge voltage dispersion ratio. From the Figure it can be seen that it is based on 4 steps to process and analyze the monitoring data of the float charge voltage. Then judge through the outputs of the 4 steps after doing cluster and weighted analysis of the 4 steps, and finally the results is calculated.

The result based on this process and analysis is not directly describing the battery capacity but only be a relative performance rank in the current battery set.

Take the followings as examples for the mathematical expression methods of the 4 steps (there are also other calculation methods to calculate the change and the dispersion ratio of the float charge voltage):

For example: the performance analysis of a battery set is done as follows:

Step 1. Represent the float charge voltage variable of a single battery relative to itself.

$$\mu_i = \frac{1}{n} \sum_{j=0}^{n} U_{ij}, \Delta U_{ij} = |U_{ij} - \mu_i| \quad (1)$$

Where:
$U_{ij}$: The voltage of the battery i at the moment j;
$\mu_i$: Average float charge voltage of the battery i in time n;
n: Sample period;

Step 2. Represent the float charge voltage variable of a single battery relative to the battery set.

$$\mu_j = \frac{1}{num} \sum_{i=1}^{num} U_{ij}, \Delta U'_{ij} = |U_{ij} - \mu_j| \quad (2)$$

Where:
$U_{ij}$: The voltage of the battery i at the moment j;
$\mu_j$: Average float charge voltage of the battery set at the moment j;
num: Battery number of the battery set.

Step 3. Represent the variable of the float charge voltage dispersion ratio of a single battery relative to itself.

$$\mu_{ik} = \frac{1}{M} \sum_{j=(k-1)*M+1}^{k*M} U_{ij}, \sigma_{ik} = \sqrt{\frac{\sum_{m=1}^{M}(U_{im} - \mu_{ik})^2}{M}} \quad (3)$$

Where:
$U_{ij}$: The voltage of the battery i at the moment j;
n: Sample period; separate the period n into K sections by each M points of time, k∈[1,K];
$U_{im}$: The float charge voltage of the battery i at the moment m in the k time section;
$\mu_{ik}$: The average float charge voltage of the battery i in the k time section;
$\sigma_{ik}$: The standard deviation of the float charge voltage in the k time section.

Step 4. Represent the variable of the float charge voltage dispersion ratio of a single battery relative to the battery set.

$$\mu_k = \frac{1}{num} \sum_{i=1}^{num} M\mu_{ik}, \sigma_k = \sqrt{\frac{\sum_{i=1}^{num}(M\mu_{ik} - \mu_k)^2}{num}} \quad (4)$$

Where:
n: Sample period; separate the period n into K sections by each M points of time, k∈[1,K];
$\mu_{ik}$: The average float charge voltage of the battery i in the k time section;
$\mu_k$: The average float charge voltage of the battery set in the k time section;
$\sigma_k$: The standard deviation of the float charge voltage of the battery set in the k time section;
num: Battery number of the battery set.

After getting the above data, do the cluster and weighted analysis for the results of each step. The general steps are as follows: the cluster analysis can divide the similar voltage variables or dispersion ratio variables into several classes, multiply them respectively with a corresponding weight by weighted calculation, add up the results to get the grade of membership of each step, and then sort the grade of membership from big to small. The batteries with big grade of membership have relatively bad performance among the battery set; the ones with small grade of membership have relatively good performance.

Every step can be used to analyze and compare the battery performance, but combining the different steps results can get more accurate battery performance. Through comparing the serial number of the batteries with bad performance which have been chosen out in each step, and find out the same battery serial number in each step, we can consider that these batteries have worse performance than others in the battery set.

Of course it can also do the cluster and weighted analysis for the results of the 4 steps together and calculate the grade of membership. The batteries with big grade of membership have relatively bad performance among the battery set; the ones with small grade of membership have relatively good performance.

Based on assumption of this method, we have done the tracking monitoring of the running condition of lots of battery sets for a long time and obtained a large number of data. We input these data to the computer and conduct verification according to this method.

Take the date of the battery set 1 for example, after eliminating the equalized charge and discharge data of the battery monitoring data from the database, input the chosen data to the software and get the calculated result:

Compared with the result of checking discharge testing, 9 batteries are picked out from the last 10 ones, 13 ones are picked out from the last 20 ones. As the time goes on, the accuracy of this method will be further improved.

The following is the No. 81 battery chosen from the battery set 1. See FIG. 5 of the data curves of the 4 steps.

Figure 5:
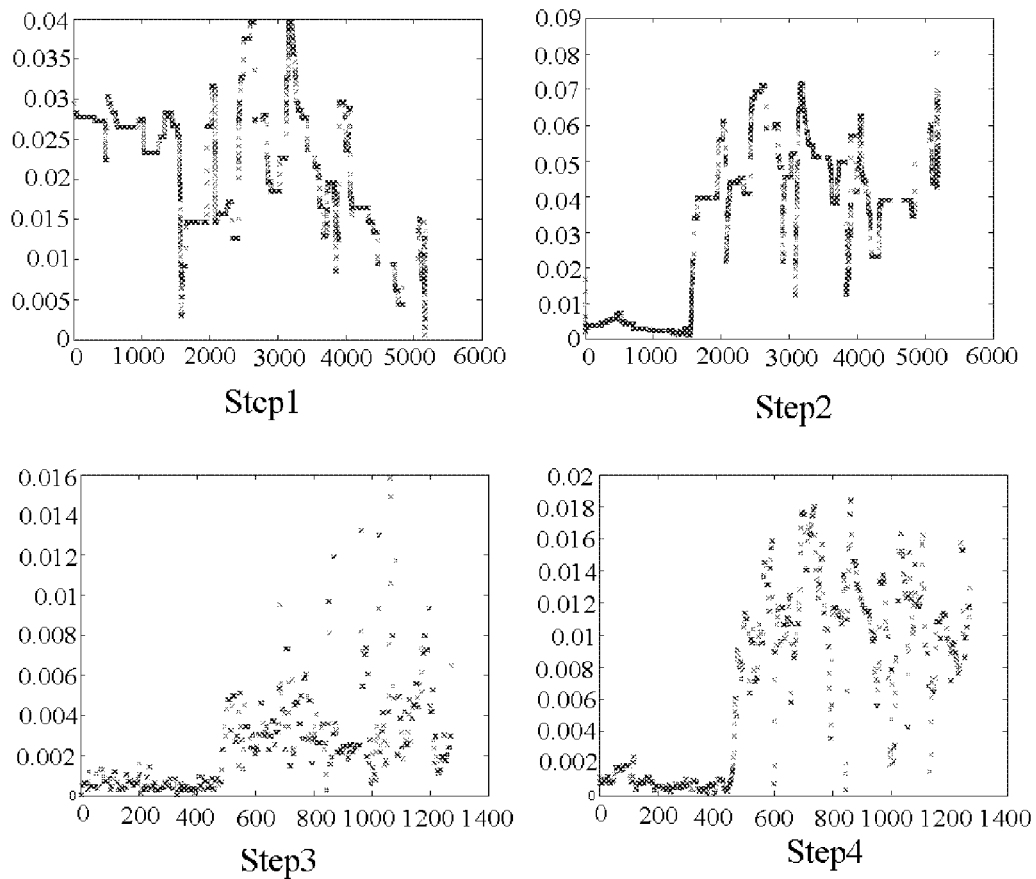
FIG. 5 is the data curve drawing of processing a battery set 1 by this invention.

In the charts of Step 1 and 2 in FIG. 5, the abscissa axis is time; the ordinates axis is the function value before the cluster analysis. If the function values in the figure have big change, it means the float charge voltage changes fast, reflecting the change of the battery IR to external disturbance. In this case, the battery will be sorted forward after the cluster analysis and picked out easily.

In the charts of Step 3 and 4 in FIG. 5, the abscissa axis is time; the ordinates axis is the dispersion ratio before the cluster analysis. It can be clearly seen that the float charge voltage dispersion ratio of the battery changes from small to big as time passes by. It can be presumed that the performance of this battery has begun to decrease.

Figure 6:
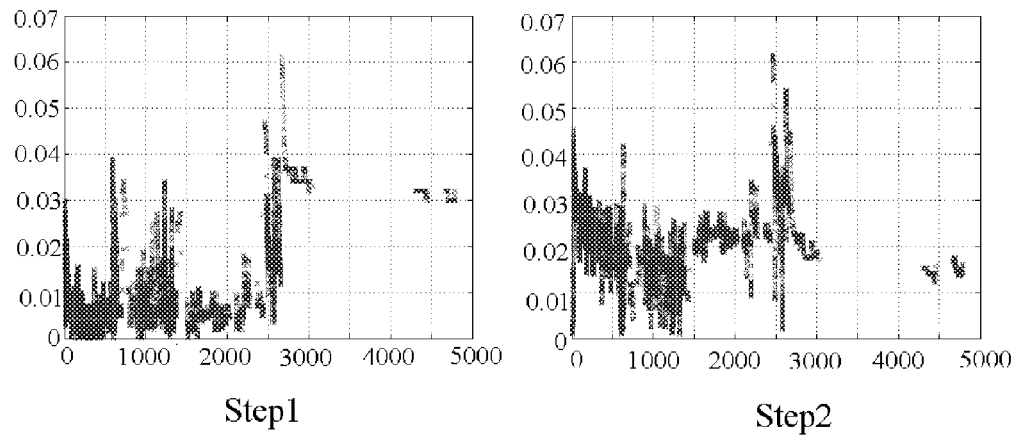
FIG. 6 is the data curve drawing of processing a battery set 2 by this invention.

The results got from the processing procedure to the data of the battery set 2 are as follows:

Most of the output results are matching the data of the checking discharge testing while there is hardly any matching the data after August 2004. Through checking the curve we can see the following points:

Take the No. 21 battery of the battery set 2 for example. See FIG. 6 for its data curves after the process of Step 1 and 2.

The information got from the data curves is: the data have big change after a long period of interrupt. We presume according to abovementioned information that this battery set 2 may be replaced in August 2004. It is proved afterward that this battery set 2 have a replacement of the whole battery set during the presumed period due to the typhoon.

To sum up, the battery performance analysis method based on the float charge voltage dispersion ratio introduced by this invention, finds a large amount of useful information about the battery condition among the data of the float charge voltage from a new perspective. Through the analysis and verification of the data of two battery sets, this method is proved that it can be used as a method of predicting the battery performance and has certain actual meaning. Moreover, this method has small workload, convenient operation and no danger to the system when doing online testing. The method also won't affect the cycle life of the VRLA battery.

It shall be understood that: the abovementioned example is only the instruction for this invention but not the limitation of it. Any invention not surpassing the actual spirit scope of this invention is under its protection.

The invention claimed is:

1. A method of conducting performance analysis of a valve-regulated lead-acid (VRLA) battery in a battery set of two or more VRLA batteries, comprising the steps of:
consecutively gathering float charge voltage variables of the VRLA battery through a measurement device, and conducting cluster and weighted analysis and obtaining results of the battery performance through a computer;
wherein the mentioned float charge voltage variables are any one or the combination of those selected from the group consisting of: float charge voltage variables of a single battery relative to itself, a float charge voltage variable of a single battery relative to the battery set, variable of the float charge voltage dispersion ratio of a single battery relative to itself and variable of the float charge voltage dispersion ratio of a single battery relative to the battery set;
wherein the float charge voltage variable of a single battery relative to itself is obtained through following steps: storing float charge voltage of each battery in a certain period; and calculating change of the float charge voltage of each battery relative to itself in this period; and
wherein the float charge voltage variable of a single battery relative to itself is calculated by equation (1):

$$\mu_i = \frac{1}{n}\sum_{j=0}^{n} U_{ij}, \Delta U_{ij} = |U_{ij} - \mu_i| \qquad (1)$$

where:
$U_{ij}$: the voltage of the battery i at the moment j;
$\mu_i$: average float charge voltage of the battery i in sample period n;
n: sample period; and
$\Delta U_{ij}$: float charge voltage variable of a single battery relative to itself.

2. The method according to claim 1, wherein the float charge voltage variable of a single battery relative to the battery set is obtained through following steps: storing the float charge voltage of each battery in a certain period; and calculating the change of the float charge voltage of each battery relative to the battery set in this period;
wherein the float charge voltage variable of a single battery relative to the battery set is calculated by equation (2)

$$\mu_j = \frac{1}{num}\sum_{i=1}^{num} U_{ij}, \Delta U'_{ij} = |U_{ij} - \mu_j| \qquad (2)$$

where:
$U_{ij}$: the voltage of the battery i at the moment j;
$\mu_j$: average float charge voltage of the battery set at the moment j;
num : battery number of the battery set; and
$\Delta U_{ij}$ :: float charge voltage variable of a single battery relative to the battery set;
wherein the variable of the float charge voltage dispersion ratio of a single battery relative to itself is obtained through following steps: storing the float charge voltage of each battery in a certain period; and calculating the variable of the float charge voltage dispersion ratio of a single battery relative to itself based on probability and statistics;
wherein the variable of the float charge voltage dispersion ratio of a single battery relative to itself is calculated by equation (3):

$$\mu_{ik} = \frac{1}{M}\sum_{j=(k-1)*M+1}^{k*M} U_{ij}, \sigma_{ik} = \sqrt{\frac{\sum_{m=1}^{M}(U_{im} - \mu_{ik})^2}{M}} \qquad (3)$$

where:
$U_{ij}$: the voltage of the battery i at the moment j;
n: sample period; separate the period n into K sections by each M points of time, $k\in[1,K]$;
$U_{im}$ : the float charge voltage of the battery i at the moment m in the k time section;
$\mu_{ik}$: the average float charge voltage of the battery i in the k time section;
$\sigma_{ik}$ : the standard deviation of the float charge voltage in the k time section;
wherein the variable of the float charge voltage dispersion ratio of a single battery relative to the battery set is obtained through following procedures: store the float charge voltage of each battery in a certain period; calculate the variable of the float charge voltage dispersion ratio of a single battery relative to the battery set based on probability and statistics; and wherein the variable of the float charge voltage dispersion ratio of a single battery relative to the battery set is calculated by equation (4):

$$\mu_k = \frac{1}{num}\sum_{i=1}^{num} M\mu_{ik}, \sigma_k = \sqrt{\frac{\sum_{i=1}^{num}(M\mu_{ik}-\mu_k)^2}{num}} \quad (4)$$

where:
- n : sample period; separate the period n into K sections by each M points of time, k ∈[1,K];
- $\mu_{ik}$ : the average float charge voltage of the battery i in the k time section;
- $\mu_k$ : the average float charge voltage of the battery set in the k time section;
- $\sigma_k$ : the standard deviation of the float charge voltage of the battery set in the k time section; and
- num: battery number of the battery set.

3. A method of conducting performance analysis of a valve-regulated lead-acid (VRLA) battery in a battery set of two or more VRLA batteries, comprising the steps of:

consecutively gathering float charge voltage variables of the VRLA battery through a measurement device, and conducting cluster and weighted analysis and obtaining results of the battery performance through a computer;

wherein the mentioned float charge voltage variables are any one or the combination of those selected from the group consisting of: float charge voltage variables of a single battery relative to itself, a float charge voltage variable of a single battery relative to the battery set, variable of the float charge voltage dispersion ratio of a single battery relative to itself and variable of the float charge voltage dispersion ratio of a single battery relative to the battery set;

wherein the float charge voltage variable of a single battery relative to the battery set is obtained through following steps: storing the float charge voltage of each battery in a certain period; and calculating the change of the float charge voltage of each battery relative to the battery set in this period; and wherein the float charge voltage variable of a single battery relative to the battery set is calculated by equation (2):

$$\mu_j = \frac{1}{num}\sum_{i=1}^{num} U_{ij}, \Delta U'_{ij} = |U_{ij}-\mu_j| \quad (2)$$

where:
- $U_{ij}$: the voltage of the battery i at the moment j;
- $\mu_j$: average float charge voltage of the battery set at the moment j;
- num: battery number of the battery set; and
- $\Delta U_{ij}'$: float charge voltage variable of a single battery relative to the battery set.

4. A method of conducting performance analysis of a valve-regulated lead-acid (VRLA) battery in a battery set of two or more VRLA batteries, comprising the steps of:

consecutively gathering float charge voltage variables of the VRLA battery through a measurement device, and conducting cluster and weighted analysis and obtaining results of the battery performance through a computer;

wherein the mentioned float charge voltage variables are any one or the combination of those selected from the group consisting of: float charge voltage variables of a single battery relative to itself, a float charge voltage variable of a single battery relative to the battery set, variable of the float charge voltage dispersion ratio of a single battery relative to itself and variable of the float charge voltage dispersion ratio of a single battery relative to the battery set;

wherein the variable of the float charge voltage dispersion ratio of a single battery relative to itself is obtained through following steps: storing the float charge voltage of each battery in a certain period; and calculating the variable of the float charge voltage dispersion ratio of a single battery relative to itself based on probability and statistics; and wherein the variable of the float charge voltage dispersion ratio of a single battery relative to itself is calculated by equation (3):

$$\mu_{ik} = \frac{1}{M}\sum_{j=(k-1)*M+1}^{k*M} U_{ij}, \sigma_{ik} = \sqrt{\frac{\sum_{m=1}^{M}(U_{im}-\mu_{ik})^2}{M}} \quad (3)$$

where:
- $U_{ij}$: the voltage of the battery i at the moment j;
- n: sample period; separate the period n into K sections by each M points of time, k∈[1,K];
- $U_{im}$: the float charge voltage of the battery i at the moment m in the k time section;
- $\mu_{ik}$: the average float charge voltage of the battery i in the k time section; and
- $\sigma_{ik}$: the standard deviation of the float charge voltage in the k time section.

5. A method of conducting performance analysis of a valve-regulated lead-acid (VRLA) battery in a battery set of two or more VRLA batteries, comprising the steps of:

consecutively gathering float charge voltage variables of the VRLA battery through a measurement device, and conducting cluster and weighted analysis and obtaining results of the battery performance through a computer;

wherein the mentioned float charge voltage variables are any one or the combination of those selected from the group consisting of: float charge voltage variables of a single battery relative to itself, a float charge voltage variable of a single battery relative to the battery set, variable of the float charge voltage dispersion ratio of a single battery relative to itself and variable of the float charge voltage dispersion ratio of a single battery relative to the battery set;

wherein the mentioned variable of the float charge voltage dispersion ratio of a single battery relative to the battery set is obtained through following procedures: store the float charge voltage of each battery in a certain period; calculate the variable of the float charge voltage dispersion ratio of a single battery relative to the battery set based on probability and statistics; and wherein the variable of the float charge voltage dispersion ratio of a single battery relative to the battery set is calculated by equation (4):

$$\mu_k = \frac{1}{num}\sum_{i=1}^{num} M\mu_{ik}, \quad \sigma_k = \sqrt{\frac{\sum_{i=1}^{num}(M\mu_{ik}-\mu_k)^2}{num}} \quad (4)$$

where:
- n: sample period; separate the period n into K sections by each M points of time, k∈[1,K];
- $\mu_{ik}$: the average float charge voltage of the battery i in the k time section;
- $\mu_k$: the average float charge voltage of the battery set in the k time section;
- $\sigma_k$: the standard deviation of the float charge voltage of the battery set in the k time section; and
- num: battery number of the battery set.

* * * * *